United States Patent [19]
Duley

[11] Patent Number: 5,841,287
[45] Date of Patent: Nov. 24, 1998

[54] SYSTEM FOR DETECTING MOTHERBOARD OPERATION TO ENSURE COMPATIBILITY OF A MICROPROCESSOR TO BE COUPLED THERETO

[75] Inventor: Raymond S. Duley, Buda, Tex.

[73] Assignee: Advanced Micro Devices, Inc., Sunnyvale, Calif.

[21] Appl. No.: 805,178

[22] Filed: Feb. 26, 1997

[51] Int. Cl.$^6$ .............................. G01R 31/28; G06F 3/00
[52] U.S. Cl. ...................... 324/537; 324/158.1; 324/538; 324/555; 395/500
[58] Field of Search ..................... 324/537, 538, 324/555, 556, 73.1, 121 R, 133, 158.1, 755, 763; 364/480, 481, 483, 484, 550, 551.01; 395/551, 555, 556, 653, 835, 836, 837, 838, 500; 702/57, 64, 75, 116, 117; 368/113, 118, 120

[56] References Cited

U.S. PATENT DOCUMENTS

| | | | |
|---|---|---|---|
| 4,833,397 | 5/1989 | McMuray, Jr. ......................... | 324/73.1 |
| 4,862,067 | 8/1989 | Brune et al. ........................... | 324/73.1 |
| 5,546,563 | 8/1996 | Chuang ................................... | 395/500 |
| 5,551,012 | 8/1996 | Chuang et al. ......................... | 395/500 |

*Primary Examiner*—Diep N. Do
*Attorney, Agent, or Firm*—Robert C. Kowert; Conley, Rose & Tayon; Kevin L. Daffer

[57] ABSTRACT

One or more detection circuits are provided for determining the operation of a motherboard prior to placing a microprocessor upon that motherboard. The detection circuit determines a particular way in which the motherboard is configured by ascertaining, for example, a power supply voltage and a clocking frequency output from the motherboard. A probe is used, in combination with the detector circuits, to determine motherboard operation at a socket to which, for example, a microprocessor can be coupled. Jumpers or switches upon the motherboard can be readily found by activating a switch and looking for a response upon the detection circuit output. If a response is not found, the jumper or switch is returned, and another jumper or switch is activated. Once the jumper or switch used for changing system clock speed and/or processor voltage is located, then a display is read as to those parameters to ensure the parameters match the processor specification. Reading the motherboard configuration and/or reconfiguring the motherboard to a different operation parameter proves beneficial in ensuring its output compatibility to a microprocessor to be inserted upon the motherboard socket.

23 Claims, 5 Drawing Sheets

SYSTEM FOR DETECTING MOTHERBOARD OPERATION TO ENSURE COMPATIBILITY OF A MICROPROCESSOR TO BE COUPLED THERETO

BACKGROUND OF THE INVENTION

1. Field of the Invention

This present invention relates to a personal computer and, more particularly, to an apparatus for sensing system bus clock speed and processor power supply voltage within a personal computer motherboard to which a microprocessor is delegated for connection.

2. Description of the Related Art

A personal computer is generally know to comprise, at a minimum, an execution unit, memory and various input/output ports. The execution unit is often referred to as a microprocessor, and the microprocessor is typically linked to the memory via a system bus. The system bus, sometimes referred to as a local bus, links address and data information sent between the microprocessor and memory. The system bus can also link the microprocessor, or memory, to various other subsystems, some of which are arranged on a single printed circuit board. The singular printed circuit board is often referred to as a motherboard.

A typical motherboard housed within a personal computer comprises one or more layers of printed conductors extending at least partially across the motherboard. The printed conductors surface at localized regions of the motherboard. Those regions allow connection of integrated or discreet devices using various connection techniques, such as plug-and-socket, wire wrap, or solder.

A substantial percentage of motherboards manufactured today can be reconfigured. Specifically, modern motherboards come equipped with numerous switches or jumpers which can alter the operation of one or more subsystems arranged thereon. For example, the clocking speed of the system bus can be modified by connecting a jumper across two pins extending from the motherboard. The power supply voltage supplied to a microprocessor can also be changed, for example, by connecting a jumper or actuating a switch. It is therefore necessary when modifying signals within printed conductors of a motherboard that the operator know which jumper to connect or which switch to activate.

Typical motherboards have numerous switches and jumpers, wherein the particular switch and jumper of interest must be identified in order to reconfigure, e.g., the system bus frequency or the processor supply voltage. Generally speaking, a motherboard is manufactured so that it can accommodate dissimilar microprocessors, or microprocessors which respond to differing system bus frequencies or power supply voltages. When assembling a personal computer, it would be desirable to quickly identify the particular jumper or switch of interest so that operation of the motherboard can be made compatible with the desired microprocessor. Once the settings are located, the motherboard can readily be altered to match the specification of a microprocessor which will thereafter be coupled to the motherboard. A mechanism for quickly identifying the jumpers or switches of interest is therefore desired so as not to damage a microprocessor subsequently linked to the motherboard.

SUMMARY OF THE INVENTION

The problems outlined above are in large part solved by a system for detecting jumper and switch settings (i.e., motherboard operation) prior to coupling a microprocessor to the motherboard. The present system employs a probe and a display remotely linked to the probe. The probe contains sensors which respond to signals within the motherboard during times when the probe connects to printed conductors embodying those signals. According to one embodiment, the sensors are designed to detect the system bus frequency and power supply voltage "seen" by a microprocessor-to-be-connected thereto. Accordingly, the probe may couple to a localized area (of socket) of the motherboard on which a microprocessor is designed for coupling.

The desirability of determining power supply voltage and system bus frequency resides in the variability at which numerous microprocessors can operate. The present system, for example, can determine if the system bus has been selected to run at 50 MHz, 60 MHz, 66 MHz, or 75 MHz. A microprocessor most certainly would fail if the system bus reads 75 MHz, but the microprocessor is designed only to handle, e.g., a 66 MHz system bus frequency. Therefore, it is beneficial to know the current clocking speed of the system bus and/or change that clocking speed prior to connecting the microprocessor. Likewise, the core section of a modem microprocessor is designed to operate at a voltage ranging, e.g., anywhere from less than 2.5 volts to greater than 3.6 volts. Knowing the voltage arising from the motherboard would be beneficial in determining if that voltage is compatible with the to-be-used microprocessor. If the voltage is dissimilar from the microprocessor specification, then the motherboard voltage can be changed by identifying the switch of interest and actuating that switch.

The probe and sensor of the present system is therefore designed not only to determine the current system bus frequency and voltage applied to the microprocessor core, but also to determine a clock multiplier setting and the voltage applied to the input/output portion of the microprocessor. Knowing the clock multiplier setting will therefore determine the differential between the system bus frequency and the internal microprocessor clocking frequency. Accordingly, the combination of system bus frequency and clock multiplier readings indicate the frequency at which the microprocessor will be operating once is it connected. If the microprocessor cannot operate at the frequency chosen, then the jumpers or switches which modify the system bus frequency and/or the clock multiplier setting can be changed.

Broadly speaking, the present invention contemplates a mechanism for detecting electronic signals. The mechanism comprises a printed circuit board having a power conductor and a clocking conductor. The power and clocking conductors are designed for powering and strobing an integrated circuit arranged upon the printed circuit board. The power and clocking conductors may be designed to embody signals which power a microprocessor core section and clock a system bus connected to the microprocessor, respectively. The mechanism also includes a probe releasibly coupled to a socket. The socket receives terminal ends of the power and clocking conductors. A detection circuit is included within the probe, wherein the detection circuit is brought in operable communication with the power and clocking conductors for determining a voltage within the power conductor and a clocking frequency within the clocking conductor. A visual display is remotely coupled to the detection circuit for illustrating the current voltage level and clocking frequency. Preferably, the printed circuit board comprises a motherboard. The socket can be either an arrangement of solder and/or wire wrap connections, or a receptacle into which a male end can be frictionally engaged. The visual display includes a first set and a second set of light emitting diodes (LEDs). Each of the first set of LEDs is responsive to a unique, predefined range of voltage, whereas each of the second set of LEDs is responsive to a unique, predefined range of the clocking frequency.

The present invention further contemplates a frequency detection circuit. The detection circuit includes a counter coupled to count a set of clocking cycles from among a plurality of clock cycles existing within a clocking signal. A timer is coupled to produce a timed output value which terminates after at least two of the set of clock cycles. A latch is coupled to receive this set of clock cycles during times when the timed output value is present. The latch produces a frequency detection output signal dependent upon the number of clock cycles which exist before the timed output value is terminated. The frequency detection circuit is preferably designed to detect the clock frequency of a system bus to which a microprocessor can be connected. The timed output value terminates after a variable number of clock cycles to indicate a clocking signal frequency in the range between, for example, 50 MHz to 75 MHz.

The present invention yet further contemplates a voltage detection circuit. The detection circuit is adapted to detect voltages within a conductor born as a terminal end within a socket. A probe is releasibly coupled to the socket. The probe comprises a plurality of pairs of comparators connecting in parallel. Each pair of comparators includes two mutual connections comprising a non-inverting input of one comparator connected to an inverting input of the other comparator. A reference voltage is connected to one of the two mutual connections and the voltage to be detected is connected to the other of the two mutual connections. Further, a plurality of conductors is connected to the output of the respective plurality of comparators, wherein only one of the plurality of conductors bears the voltage to be detected. Preferably, the voltage detection circuit detects voltage within a motherboard used to supply power to a microprocessor core section. The voltage to be detected activates a light emitting diode next to indicia indicating a detected voltage amount. A light emitting diode is therefore dedicated to a specific range of voltages, and a plurality of light emitting diodes are used to indicate separate and distinct voltage ranges.

BRIEF DESCRIPTION OF THE DRAWINGS

Further advantages of the present invention will become apparent to those skilled in the art upon reading the following description of the preferred embodiments and upon reference to the accompanying drawings in which.

Figure 1:
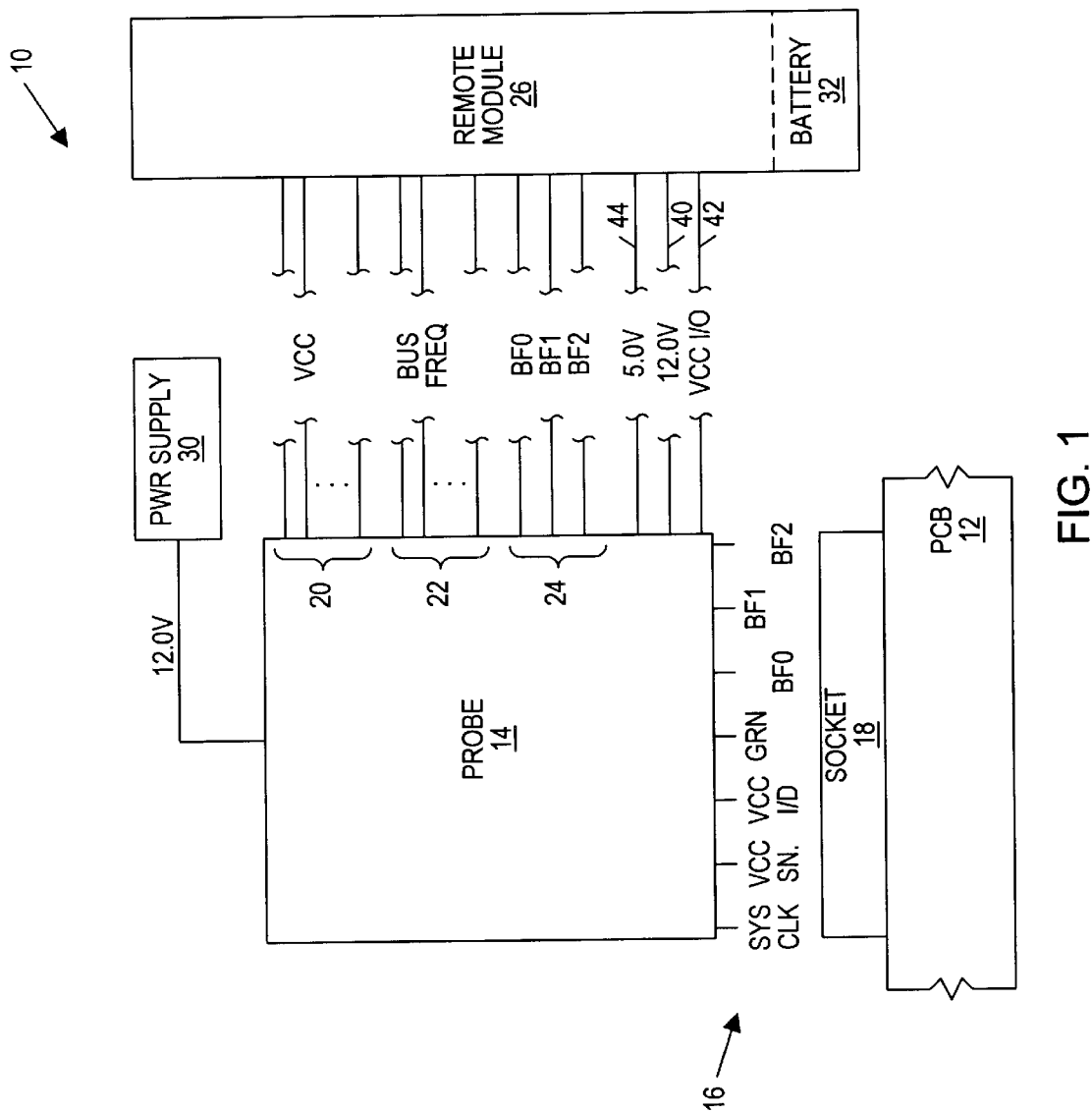
FIG. 1 is a block diagram of a system for determining motherboard operation according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 illustrates a system 10 for determining operation of a printed circuit board (PCB). Preferably, PCB is a motherboard configured within the chassis of a personal computer. PCB 12 preferably comprises one or more dielectrically spaced layers, each of which comprise numerous printed conductors. Those conductors embody numerous signals, including a signal indicative of a system bus frequency (SYS CLK), a processor core voltage (VCC SN), a processor input/output voltage (VCC I/O), and clock multiplier signal voltage (BF0, BF1 and BF2). The signals of interest needed for detection by probe 14 can be contacted by a series of receptors 16 extending from probe 14. Receptors 16 align with and contact corresponding conductors within PCB 12. Preferably, receptors 16 align with terminal ends of the conductors, those terminal ends accumulated within, for example, a socket 18. Socket 18 occupies a relatively small portion of one surface of PCB 12. Socket 18 preferably comprises a plurality of mating receptors (not shown) arranged to electrically communicate with receptors 16 such that a plurality of electrical connections can be releasably made between probe 14 and socket 18. According to one embodiment, receptors 16 align with pins normally associated with a microprocessor, and that pins of interest within the microprocessor are substituted by corresponding receptors of probe 14. Thus, system clock, processor core and input/output voltages, ground, and clock multiplier pins extending from probe 14 match the arrangement at which those pins would normally extend from a microprocessor into socket 18.

Probe 14 includes not only receptors 16, but also one or more detection circuits electrically connected to receptors 16. The detection circuits, according to one embodiment, comprise a voltage detection circuit and a frequency detection circuit. The voltage detection circuit senses processor core voltages delivered by socket 18, and labeled as VCC SN. Similarly, the frequency detection circuit senses the frequency of system clock (SYS CLK) delivered from socket 18. The voltage detection circuit dispatches a voltage upon one of a plurality of voltage output conductors 20 dependent upon the amount of voltage detected within VCC SN. Similarly, the frequency detection circuit outputs a voltage upon output frequency conductors 22 dependent upon the frequency of SYS CLK. The clock multiplier signals BF0, BF1 and BF2 are dispatched directly to clock multiplier outputs 24. Conductors 20, 22 and 24 are preferably covered within a ribbon cable extending between probe 14 and remote module 26. Contained within remote module 26 are a series of light emitting diodes (LEDs). The pattern in which the LEDs illuminate is dependent upon which conductor of conductors 20, 22 and 24 receive an illumination voltage.

Power necessary to operate remote module 26 and detectors within probe 14 arise from one of possibly three sources. Firstly, power can be supplied from a supply 30 within the personal computer. Supply 30 generates voltages needed to connect, for example, devices normally associated with a personal computer such as a disk drive, CD ROM, etc. Supply 30 generates, for example, 5.0 V and 12.0 V from a four-pin adapter well know in the art. Secondly, power can arise from PCB 12. Specifically, PCB 12 contains a conductor which carries the input/output voltage of an input/output section of the microprocessor (VCC I/O). VCC I/O is typically around 3.3 volts, which can be converted to any voltage necessary to operate module 26 or detectors within probe 14. Thirdly, power can arise from a battery 32 within remote module 26. The battery (or batteries) are preferably housed within remote module 26, wherein their voltage is carried to probe 14 via a conductor within the ribbon cable. More specifically, battery voltage and various other power supply voltages are linked between probe 14 and remote module 26, and are converted within probe 14 as shown in further detail in FIG. 2.

Figure 2:
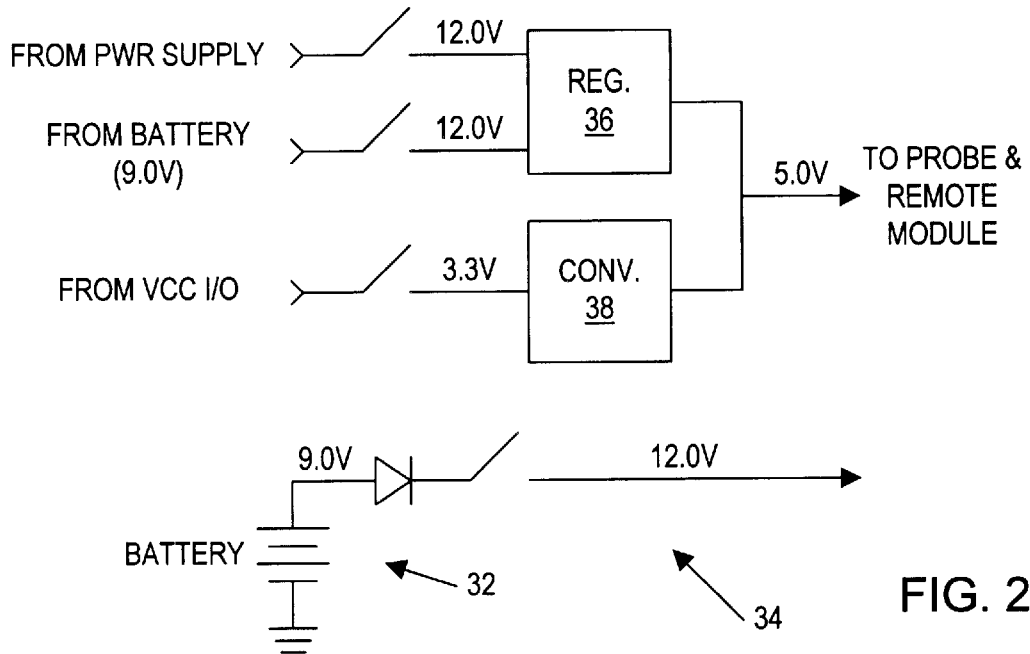
FIG. 2 is a block diagram of various voltages supplied to operate the probe and remote module of FIG. 1.

Referring to FIG. 2, the voltage within battery 32 may be enhanced according to one embodiment so that a 9.0 V output is converted to 12.0 V as shown in the circuit schematic represented as numeral 34. Thus, a voltage regulator 36 can be used to decrease the normally 12.0 V output from supply 30 (shown in FIG. 1) and from the 12.0 V stepped-up from the 9.0 V battery supply. Regulator 36 is contained within probe 14 to convert the 12.0 V amounts to a 5.0 V voltage compatible with the various detection circuits within probe 14 and the LEDs within remote module 26. Similarly, the 3.3 V from VCC I/O is increased by converter 38 to a 5.0 V level. The various voltages (12.0 V and VCC I/O) arising from battery 32, power supply 30 and PCB 12 (shown in FIG. 1) are coupled by conductors 40 and 42. The output from a regulator 36 or converter 38 (shown in FIG. 2) is preferably 5.0 V, which is connected between probe 14 and remote module 26 via conductor 44 (shown in FIG. 1).

Figure 3:
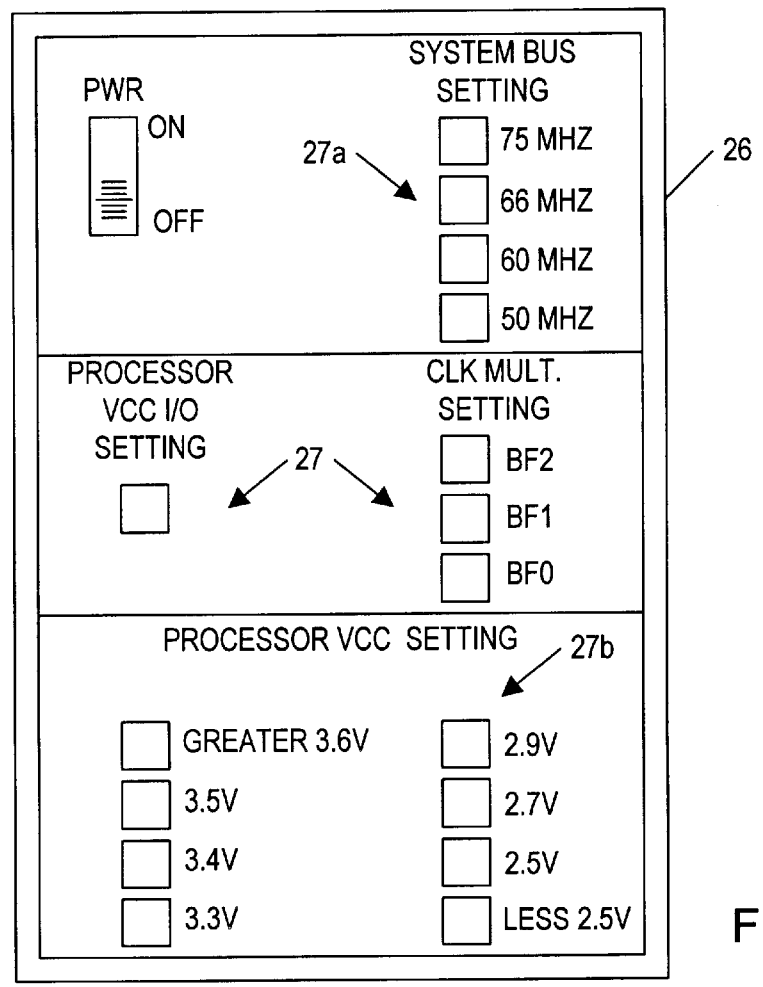
FIG. 3 is a plan diagram of LEDs arranged across a remote module, each of which are uniquely illuminated in response to activation of an on/off switch also arranged on the remote module.

FIG. 3 illustrates the arrangement of LEDs 27 across an outer surface of remote module 26. Importantly, next to each LED is indicia which identifies various operating characteristics of conductors within PCB 12. Importantly, those characteristics indicate the environment in which a microprocessor connectable to socket 18 is expected to endure. FIG. 3 illustrates an example of four similar system bus clocking frequencies, three clock multiplier settings, and eight processor core power settings. It is recognized, however, that the face of remote module 26, and the arrangement of LED can be modified to accommodate more or less than the number of LEDs and the indicia shown in FIG. 3. For example, more than four system bus setting LEDs can be utilized, and the indicia next to each LED can be changed to indicate a frequency dissimilar to that shown.

Figure 4:
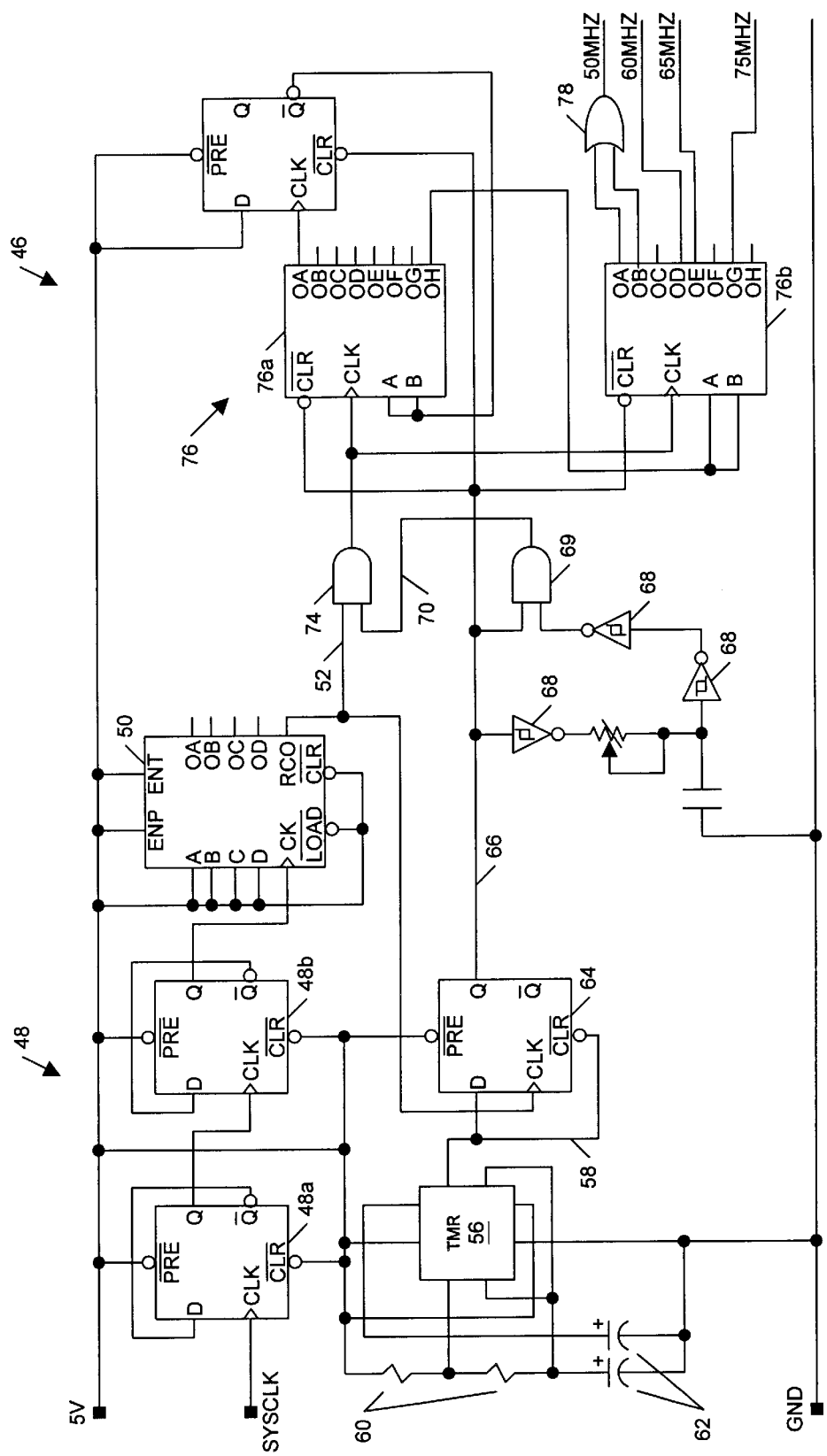
FIG. 4 is a circuit schematic of a frequency detection circuit used in determining the clocking frequency of a system bus within the motherboard to which a microprocessor can be coupled.

Turning now to FIG. 4, a frequency detection circuit 46 is shown according to one embodiment. Detection circuit 46 includes a clock divider circuit 48 made up of a pair of D-type flip flops 48a and 48b. The clocking input of flip-flop 48a is connected to receive the system bus clocking signal (SYS CLK). The complimentary output of flip-flop 48a is fed back to the D input so that flip-flop 48a transition on the following edge of each SYS CLK cycle. The clocking input of flip-flop 48b receives the true output from flip-flop 48a, and the feedback arrangement of flip-flop 48b affords an output which transitions at each falling edge of the output signal emanating from flip-flop 48a. Accordingly, the arrangement of flip-flops 48a and 48b produces a clocking signal input to counter 50 that is preferably one quarter the clocking frequency of SYS CLK. Counter 50 is connected such that a count occurs during each clock cycle and once a series of counts have been achieved, a carry signal is output from ripple carry out (RCO) pin. The carry output preferably occurs after the sixteenth cycle, and is referenced as numeral 52. Accordingly, counter 50 counts a set of clock cycles from among a plurality of clock cycles existing within SYS CLK. A timer 56 is coupled to produce a timed output value upon conductor 58. The duration of timed output value is set based on the ratio of resistors 60 and capacitors 62 externally connected to timer 56. Preferably, the ratio of resistors and capacitors produces a timed output value which exceeds at least two pulses of carry signal 52. Accordingly, D-type flip-flop 64 produces a signal on conductor 66 which is synchronized with the transitions of carry output signal 52. Signal within conductor 66 is maintained in a monostable state based on the arrangement of a series of one-shot inverters 68 and AND gate 69 ensures a timed output value within conductor 70 of a duration greater than at least two clock cycles within conductor 52 but preferably less than 16 clock cycles, according to one preferred embodiment. Thus AND gate 74 produces a series of clock signals, the number of which is dependent on the duration of the timed output value within conductor 70. The number of clock cycles determine which output from latch/registers 76 will be active. Register 76 include a series coupled pair of eight bit parallel-out serial shift registers 76a and 76b. Output from the eighth bit of register 78a is fed to the inputs of registers 76b to continue registering up to 16 bits. The ninth and tenth bit outputs are fed to OR gate 78.

The operation of detection circuit 46 is predicated on the ratio of clock signals within SYS CLK to the timed output value from timer 56. If SYS CLK is relatively slow, fewer numbers of clock transitions will occur within the timed output value. In this instance, maybe only the ninth or tenth bit will be set rather than continuing until possibly the fourteenth or fifteenth, etc. A logic one value output from OR gate 78 indicates SYS CLK set at, for example, 50 MHz. If SYS CLK is faster, then register 76 will indicate a higher order bit set prior to termination of the timed output value. For example, a higher SYS CLK frequency will set bit twelve, thirteen or fifteen indicating, for example, 60 MHz, 66 MHz, or 75 MHz, respectively. Registers 76 latches the particular output value at the termination of the timed output value, and maintains that latched value till the timed output value is reasserted.

Figure 5:
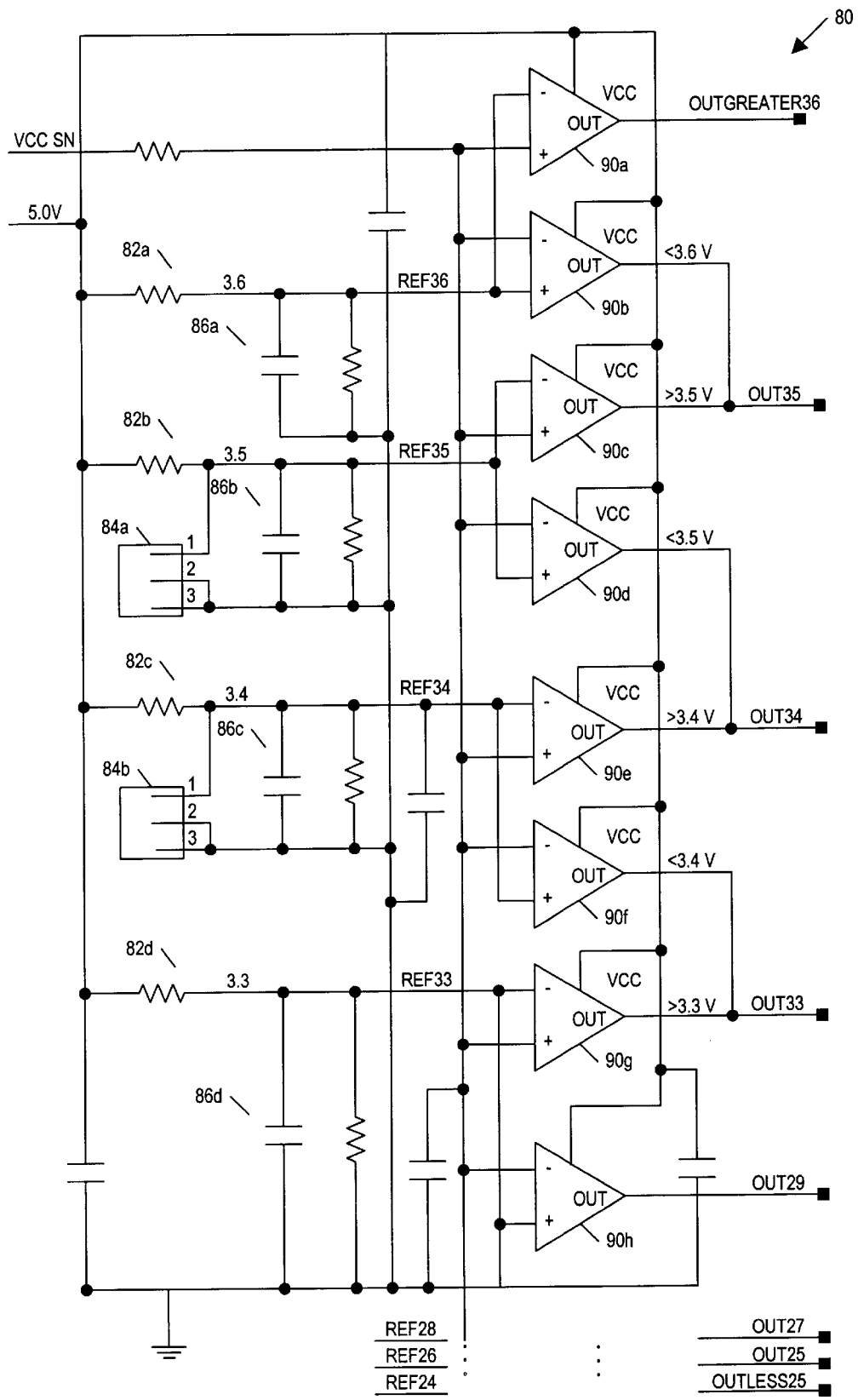
FIG. 5 is a circuit schematic of a voltage detection circuit used in determining a voltage of a power supply conductor within the motherboard to which a microprocessor can be coupled.

Referring to FIG. 5, a voltage detection circuit is shown. Detection circuit 80 exists within the detection unit of probe 14, and is coupled to receive the processor core voltage (VCC SN) delivered from PCB 12. Circuit 80 is also coupled to receive a regulated/converted 5.0 V from either power supply 30, VCC I/O or battery 32. The 5.0 V amount is reduced to differing amounts dependent upon the resistor values of voltage divider networks 82a–82d. A variable resistor (or potentiometer) 84 may be coupled to complete the resistor divider network by varying the amount of resistance within each potentiometer, the voltage existing between the fixed and variable resistor will correspondingly change. A potentiometer need not be used in all cases, however. In some instances, the resistor pair values can be fixed dissimilar from each other, such as those used in forming voltage dividers 82a and 82d. In other cases, the resistance can vary in one resistor within a pair of voltage divider resistors, such as the case in voltage dividers 82b and 82c. The fixed and variable resistance values are established so as to form a voltage less than 5.0 V at a node between the resistor pairs. In the example shown in FIG. 5, a separate and unique voltage is produced at a node between voltage divider resistor pairs for each voltage divider 82a, 82b, 82c and 82d. Those values can be arbitrarily chosen and are shown according to one example as 3.6 V, 3.5 V, 3.4 V and 3.3 V, respectively. The voltages so produced pass through a low frequency pass filter 86a–86d to form reference voltages denoted as REF36, REF35, REF34 and REF33, respectively. Filter 86 ensures a substantial amount of noise once the reference voltages are removed from the input of voltage comparators 90a–90h. Comparators 90 are arranged into a plurality of pairs of comparators connected in parallel. A first pair shown as 90a and 90b, has two mutual connections. A first mutual connection is coupled to receive a reference voltage from voltage divider 82a. A second mutual connection is coupled to receive VCC SN. The inverting and non-inverting inputs are connected so that if VCC SN exceeds REF36 (e.g., 3.6 V) then the output from comparator 90a will transition to a logic high value, but the output from comparator 90b will transition to a logic low value. On the other hand, if VCC SN is less than REF36, then the output from comparator 90a will transition to a logic low value while the output from comparator 90b will transition to a logic high value.

The output from comparator 90b is logically ORed with the output of comparator 90c. The logic OR coupling produces a logic high value at OUT35 with output from both the comparator 90b and 90c being active high. This occurs when VCC SN is less than REF36 but is greater than REF35. If, for example, REF36 represents 3.6 V and REF35 represents 3.5 V, then OUT35 will be active high when VCC SN is within the range between 3.5 and 3.6 V.

The OR connection from outputs of comparators 90b and 90c is continued through comparators 90d and 90e, comparators 90f and 90g, etc. Thus, OUT34 is active if both comparator 90d and 90e is active, and OUT36 is active if both comparator 90f and 90g are active. In the embodiment shown in FIG. 5, examples of reference voltages 3.6 V, 3.5 V, 3.4 V and 3.3 V produce separate distinct output signals from detector circuit 80 relative to those reference voltages. Thus, conductor OUTGREATER36 is active when VCC SN is greater than 3.6V. OUT35 is active if VCC SN is between 3.5 V and 3.6 V. OUT34 is active is VCC SN is between 3.4 V and 3.5 V. OUT33 is active if VCC SN is between 3.0 V and 3.4 V.

FIG. 5 illustrates, for sake of brevity, five output conductors, each carrying a separate and distinct voltage. It is recognized, however, that more than five output conductors can be used. For example, the connection can be continued almost indefinitely with additional voltage dividers, low-pass filters and comparators to form additional output signals having voltages different from those shown. For example, circuit 80 can be extended to produce REF28, REF26 and REF24. REF28, in combination with REF33 produce a window which activates 0UT29. Likewise, REF26, in combination with REF28, produce OUT27 from a comparator (not shown). Still further, REF24, in combination with REF26 produce a signal OUT25 from the output of a comparator (not shown).

FIG. 5 illustrates an example of several reference voltages and several corresponding output voltages if VCC SN falls within a window between a pair of reference voltages. The reference voltages shown are only for sake of example. Given the exemplary reference voltages, a VCC SN which exceeds 3.6 V will produce an output signal upon a conductor OUTGREATER36 and not produce signals on the other output conductors. The same applies if VCC SN is less than 3.6 V, in which case the voltage upon VCC SN is dependent upon the particular window (or range) in which it falls between specified reference voltages. If VCC SN is less than 2.5 V, then an output voltage will appear only upon output conductor OUTLESS25. All of the various voltage comparators 90 can be found within an integrated circuit. The output of the integrated voltage comparators are open collector outputs and are driven to ground if the input to the inverting input is more positive than input to the non-inverting input. Conversely, the output is driven high if the non-inverting input is more positive than the inverting input.

Figure 6:
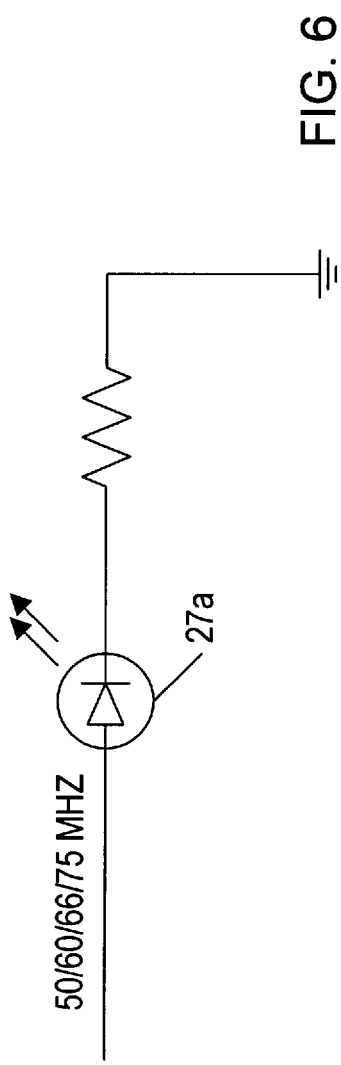
FIG. 6 is a circuit schematic of a first set of LEDs within the remote module responsive to the voltage detected; and, FIG. 7 is a circuit schematic of a second set of LEDs within the remote module responsive to the clocking frequency detected.
Figure 7:
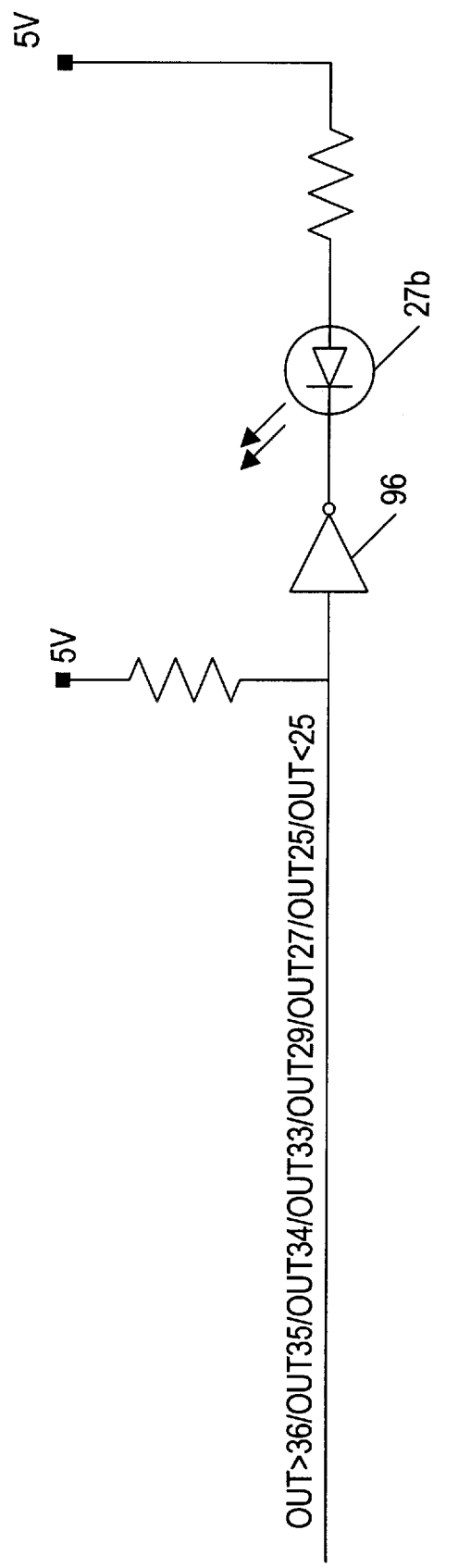

FIGS. 6 and 7 illustrate circuitry within the remote module. FIG. 6 depicts an LED 27a which emits a light if a signal transferred thereto has a logic high value. Thus, FIG. 6 illustrates one of the possible four conductors output from the frequency detection circuit 46, shown in FIG. 4. The output conductor can be either the 50 MHz, 60 MHz, 66 MHz or 75 MHz conductor. It is recognized that the circuit shown is repeated for each output conductor. For sake of brevity, only one output conductor is shown and is recognized to be either the 50, 60, 66 or 75 MHz conductor. It is further recognized that the conductor of FIG. 6 is repeated for each output of detection circuit 46.

FIG. 7 depicts one conductor of possibly numerous conductors output from voltage conductor circuit 80. It is recognized that the conductor, and LED 27b is repeated for each output conductor. Whenever the voltage upon the output conductor transitions to a high voltage value, then inverter 96 will cause LED 27b to illuminate. The resistance values for the resistors shown in FIG. 7 as well as the resistor shown in FIG. 6 will vary depending upon the amount of current needed to activate and deactivate LEDs 27a and 27b.

It will be appreciated to those skilled in the art having the benefit of this disclosure that this invention is believed to be capable of activating a separate and distinct LED based upon a frequency detected within a system bus clocking conductor or a voltage detected within a processor core power supply conductor. Both the system bus clocking conductor and the power supply core conductor are configured within any PCB to which a microprocessor can be attached. Accordingly, the present invention is used to determine operation of the motherboard at a socket source prior to connecting the microprocessor. The motherboard operation can be changed after detection by the present detection system by actuating switches or coupling jumpers. The present invention is therefore believed to have benefit is locating the switch and jumper locations necessary to change motherboard signals and to therefore ensure compatibility to a microprocessor being coupled. The number of LEDs used to signal system bus setting, or processor core VCC SN will vary, and therefore, the number presented therein is not to limit the present invention. The detection circuits can therefore be expanded, the timed output value duration can be modified, the reference voltages changed, and the LED indicia on the remote module modified depending upon the breadth at which the detection circuits must operate to ascertain various motherboard configurations. Accordingly, various modifications and changes may be made without departing from the spirit and scope of the invention as set forth in the claims. It is intended that the following claims be interpreted to embrace all such modifications and changes. The specification and drawings are to be regarded in an illustrative rather than a restrictive sense.

What is claimed is:

1. A mechanism for detecting electronic signals, comprising:

a printed circuit board configured to receive an integrated circuit wherein said printed circuit board comprises a power conductor and a clocking conductor, wherein said power conductor is adapted to provide a power signal to said integrated circuit and said clocking conductor is adapted to provide a clocking signal to said integrated circuit;

a probe releasably coupled to a socket which receives terminal ends of said power conductor and said clocking conductor;

detection circuit within said probe in operable communication with said power conductor and said clocking conductor for determining a voltage within said power conductor and said clocking signal within said clocking conductor; and a visual display remotely coupled to the detection circuit for illustrating a magnitude of the voltage and a frequency of the clocking signal.

2. The mechanism as recited in claim 1, wherein said power conductor and said clocking conductor are each at least partially embedded within said printed circuit board.

3. The mechanism as recited in claim 1, wherein said socket is configured to receive a microprocessor.

4. The mechanism as recited in claim 3, wherein said microprocessor is received within said socket after said probe is released.

5. The mechanism as recited in claim 1, wherein said probe is frictionally coupled to the socket.

6. The mechanism as recited in claim 1, wherein said probe comprises a plurality of pins extending from an encasement of the probe, and wherein the pins extend in frictional engagement with the terminal ends.

7. The mechanism as recited in claim 1, wherein the printed circuit board further comprises a plurality of switches for changing magnitude of said voltage and frequency of said clocking signal to match an operating voltage and an operating frequency of a microprocessor coupled to the socket after the probe is released therefrom.

8. The mechanism as recited in claim 1, wherein said printed circuit board further comprises another power conductor and a plurality of clock multiplier conductors which control a differential between a frequency of the clocking signal and a frequency of a strobe signal used to clock a microprocessor which is adapted for coupling to the socket.

9. The mechanism as recited in claim 8, wherein said voltage supplies power to a core section of the microprocessor and said another power conductor embodies another voltage used to supply power to an input/output portion of the microprocessor.

10. The mechanism as recited in claim 8, wherein said microprocessor comprises a bus interface unit connected between a local bus responsive to said clocking signal and a system bus responsive to said strobe signal.

11. The mechanism as recited in claim 8, wherein said detection circuit is powered by either a battery housed within said visual display, said another power conductor, or a four-pin connector extending from a personal computer power supply.

12. The mechanism as recited in claim 1, wherein said visual display comprises:

a first set of light emitting diodes, each of which is responsive to a unique, predefined range of said voltage; and a second set of light emitting diodes, each of which is responsive to a unique, predefined range of frequencies emitted by said clocking signal.

13. The mechanism as recited in claim 1, wherein said visual display and said detection circuit are remotely coupled via a ribbon cable comprising a plurality of elongated conductors.

14. The mechanism as recited in claim 1, wherein said visual display and said detection circuit are remotely coupled via wireless communication.

15. A system for detecting motherboard operation to ensure compatibility of a microprocessor to be coupled thereto, the system comprising:

a pin for contacting a clock conductor within a microprocessor socket, said clock conductor configured for supplying a clock signal to the microprocessor;

a pin for contacting a power conductor within the microprocessor socket, said power conductor configured for supplying power to the microprocessor;

a frequency detection circuit for determining the frequency of said clock signal;

a voltage detection circuit for determining the voltage level of said power conductor;

wherein said pin for contacting a clock conductor, said pin for contacting a power conductor, said frequency detection circuit, and said voltage detection circuit are all included within a probe, wherein said probe is configured to be releasably coupled to the microprocessor socket; and a display coupled to said probe, wherein said display is configured to separately display the voltage level of said power conductor and the frequency of the clocking signal.

16. The system as recited in claim 15, wherein said probe further includes a plurality of pins for contacting a plurality of clock multiplier conductors within the microprocessor socket, said plurality of clock multiplier conductors configured for controlling a differential between the clock signal frequency and an internal microprocessor clock frequency, and wherein said display is further configured to display said differential.

17. The system as recited in claim 15, wherein said display is remote from said probe.

18. The system as recited in claim 15, wherein said probe receives power to operate from a battery housed within said display.

19. The system as recited in claim 15, wherein said probe receives power to operate from a personal computer power supply.

20. The system as recited in claim 15, wherein said probe receives power to operate from the microprocessor socket.

21. The system as recited in claim 15, wherein said probe is capable of receiving power to operate from either a battery housed within said display, a personal computer power supply, or the microprocessor socket.

22. A method for detecting motherboard operation to ensure compatibility of a microprocessor to be coupled thereto, the method comprising:

before inserting the microprocessor into a microprocessor socket on the motherboard, plugging a probe into the microprocessor socket;

within said probe, detecting the clock frequency and voltage level that the motherboard is configured to supply to the microprocessor socket;

displaying the clock frequency and voltage level on a display;

reconfiguring jumpers or switches on the motherboard until the display indicates that the correct frequency and voltage level are supplied to the microprocessor socket;

removing the probe from the microprocessor socket; and inserting the microprocessor into the microprocessor socket.

23. The method as recited in claim 22, further comprising locating the jumper or switches on the motherboard that control the clock frequency and voltage level to be supplied to the microprocessor socket by activating a switch or jumper and looking for a response on said display.

* * * * *